(12) United States Patent
Maegawa et al.

(10) Patent No.: US 7,488,904 B2
(45) Date of Patent: Feb. 10, 2009

(54) RESIN MOLDED COMPONENT FITTED WITH A METAL PLATE AND MOLDING METHOD THEREFOR

(75) Inventors: Akihito Maegawa, Yokkaichi (JP); Shinyu Nagashima, Yokkaichi (JP)

(73) Assignee: Sumitomo Wiring Systems, Ltd. (JP)

( * ) Notice: Subject to any disclaimer, the term of this patent is extended or adjusted under 35 U.S.C. 154(b) by 44 days.

(21) Appl. No.: 11/820,980

(22) Filed: Jun. 21, 2007

(65) Prior Publication Data
US 2008/0123261 A1 May 29, 2008

(30) Foreign Application Priority Data
Jun. 22, 2006 (JP) .............................. 2006-172601

(51) Int. Cl.
*H01L 23/28* (2006.01)
(52) U.S. Cl. ...................... 174/521; 174/68.2; 174/536; 174/541; 439/625
(58) Field of Classification Search ................ 174/68.2, 174/536, 541, 521; 439/76.2, 625
See application file for complete search history.

(56) References Cited

U.S. PATENT DOCUMENTS

| 5,797,757 | A | * | 8/1998 | Aoki | ........................... 439/101 |
|---|---|---|---|---|---|
| 6,152,776 | A | * | 11/2000 | Ikeda et al. | ................. 439/627 |
| 6,466,451 | B2 | * | 10/2002 | Mizuno et al. | .............. 361/796 |
| 6,650,024 | B2 | * | 11/2003 | Yamane et al. | ............. 307/10.1 |
| 6,712,623 | B2 | * | 3/2004 | Sumida | ..................... 439/76.2 |
| 6,870,096 | B2 | * | 3/2005 | Suzuki et al. | ................. 174/50 |
| 7,077,704 | B2 | * | 7/2006 | Ikeda et al. | ................. 439/627 |
| 7,414,194 | B2 | * | 8/2008 | Nakayama et al. | ......... 174/68.2 |
| 2007/0026744 | A1 | * | 2/2007 | Takanashi | .................... 439/736 |

FOREIGN PATENT DOCUMENTS

| JP | 11203946 | * | 7/1999 |
|---|---|---|---|
| JP | 2002-359020 | | 12/2002 |
| JP | 2003-109679 | | 4/2003 |

* cited by examiner

*Primary Examiner*—Hung V Ngo
(74) *Attorney, Agent, or Firm*—Gerald E. Hespos; Anthony J. Casella

(57) ABSTRACT

A sensor unit (1) has a metal plate (10), a resin molded portion (20) and an oil temperature sensor (2). Busbars (4) made of a metal are arranged in the resin molded portion (20). Since the busbars (4) are insert-molded while having the exposed ends (4A) thereof tightly held by a pair of forming dies, a distance between the exposed ends (4A) and the placing surface 10A is held constant. Further, gate marks (5D) of the oil temperature sensor (2) are accommodated in recesses (10B) of the placing surface (10) and engaging grooves (9) and engaging projections (26A) are engaged. Thus, the oil temperature sensor (2) can be held in a proper posture. Additionally, the oil temperature sensor (2) can be held on the placing surface (10A) by riveting the exposed end (4A) and a terminal (8) of the oil temperature sensor (2).

10 Claims, 4 Drawing Sheets

RESIN MOLDED COMPONENT FITTED WITH A METAL PLATE AND MOLDING METHOD THEREFOR

BACKGROUND OF THE INVENTION

1. Field of the Invention

The invention relates to a resin molded component fit with a metal plate and to a molding method therefor.

2. Description of the Related Art

The terminal of an electronic component generally is connected to a wiring member by soldering or riveting. However, a riveted connection to a busbar fixed to a resin molded component is not easy. More particularly, to fix a busbar to a resin molded component, a resin rib generally is formed to stand on a base plate. The rib then is inserted through a through hole in the busbar and is squeezed at high temperature. However, the fixed position of the busbar is likely to vary due to changes in pressure, temperature and other factors upon squeezing the rib. If the busbar and the electronic component are connected forcibly by riveting, the mount position of the electronic component is restrained by the position of the busbar. Therefore the electronic component is fixed at a position displaced from the originally set mount position.

For the above reason, a busbar generally is connected with a member, such as an electronic component, a printed circuit board, or the like, by soldering, and a wire or a flat cable is interposed between the busbar and the other member, as shown in Japanese Unexamined Patent Publication No. 2002-359020.

The flat cable that is interposed in the above-described solder connection increases the number of parts and the soldering operation adds to the cost. Further, capacitance will decrease if the interposed flat cable has a smaller capacitance than the busbar despite the use of the busbar in view of good capacitance.

In view of the above, an object of the invention is to enable the connection of a busbar fixed to a resin molded component and an electronic component by riveting.

SUMMARY OF THE INVENTION

The invention relates a resin molded component fit with at least one metal plate. The metal plate is an insert in the molding of the resin molded component so that a unitary matrix of the resin surrounds and engages at least part of the metal plate. At least one electronic component is arranged at or near the resin molded portion, and at least one busbar also is inserted molded at least partly in the resin molded portion. The electronic component is held on a surface of the metal plate by riveting or otherwise fixing a portion of the busbar exposed from the resin molded portion to a terminal of the electronic component.

The exposed portion of the busbar is held tightly between a pair of forming dies during the insert-molding of the resin molded portion so that the positional accuracy of the exposed part of the busbar is improved. Thus, the electronic component can be held at a substantially proper mount position if the terminal of the electronic component and the exposed portion of the busbar are fixed by riveting or the like. There is no likelihood that the electronic component is held distanced from the surface of the metal plate and no unnecessary stress acts on connected parts by the interference of the electronic component with the surface of the metal plate. Further, there is no wire interposed between the electronic component and the busbar, and hence there is no chance of decreasing the capacitance.

The electronic component preferably includes a main portion made of synthetic resin and formed by injection molding.

The electronic component preferably is formed with at least one molding gate at a part of the main portion in contact with the metal plate. The metal plate preferably is formed with at least one recess for accommodating a gate mark formed on the main portion of the electronic component substantially in correspondence with the gate. The electronic component can be placed on the surface of the metal plate in the proper posture by accommodating the gate mark of the electronic component into the recess of the surface of the metal plate. Thus, the electronic component will not be inclined by interference of the gate mark thereof with the surface of the metal plate. As a result, the terminal of the electronic component and the exposed end of the busbar can be placed accurately one over the other before the connection by riveting, and riveting can be performed more easily.

The resin molded portion preferably includes a primary molded portion insert-molded to be integral to the metal plate, and at least one secondary molded portion insert-molded to be integral to the primary molded portion and to surround at least part of the busbar.

Accordingly, the primary molded portion that has been insert-molded to be integral to the metal plate is used as a core, and the busbar can be insert-molded during the secondary molding. Thus, the positional accuracy of the exposed end of the busbar relative to the surface of the metal plate can be improved as compared to the case where the busbar is insert-molded during the primary molding.

Guiding walls preferably project integrally from the surface of the metal plate for positioning and holding the electronic component before the connection by riveting. Accordingly, it is not necessary to fix the electronic component by hand to prevent the electronic component from moving on the surface of the metal plate prior to riveting.

The electronic component and the guiding walls preferably include engaging portions and engaging grooves that are engageable with each other. The engaging portions and the engaging grooves enable the electronic component to be slid into a clearance between the guiding walls to position the electronic component relative to the surface of the metal plate. Thus, the electronic component is held and is not easily detachable before the riveting. Accordingly, the terminal of the electronic component will not displace vertically even if a force is exerted on the terminal during the connection by riveting, and therefore riveting can be performed reliably.

The invention also relates to a molding method for a resin molded component, as described above, fit with at least one metal plate. The method comprises providing at least one metal plate, insert-molding a resin molded portion to be integral to the metal plate, arranging at least one electronic component at or near the resin molded portion, insert-molding at least part of a busbar in the resin molded portion, and fixing a portion of the busbar exposed from the resin molded portion to a terminal of the electronic component to hold the electronic component on a surface of the metal plate.

The electronic component includes a main portion made of synthetic resin. The method preferably includes injection molding the main portion to include at least one molding gate at a part of the main portion in contact with the metal plate, and forming at least one recess in the metal plate for accommodating the gate mark on the main portion of the electronic component.

The step of insert-molding the resin molded portion preferably includes insert-molding a primary molded portion to be integral to the metal plate, and insert-molding at least one secondary molded portion to be integral to the primary molded portion and surrounding at least part of the busbar.

These and other objects, features and advantages of the present invention will become more apparent upon reading of the following detailed description of preferred embodiments and accompanying drawings. It should be understood that even though embodiments are separately described, single features thereof may be combined to additional embodiments.

DETAILED DESCRIPTION OF THE PREFERRED EMBODIMENTS

Figure 1:
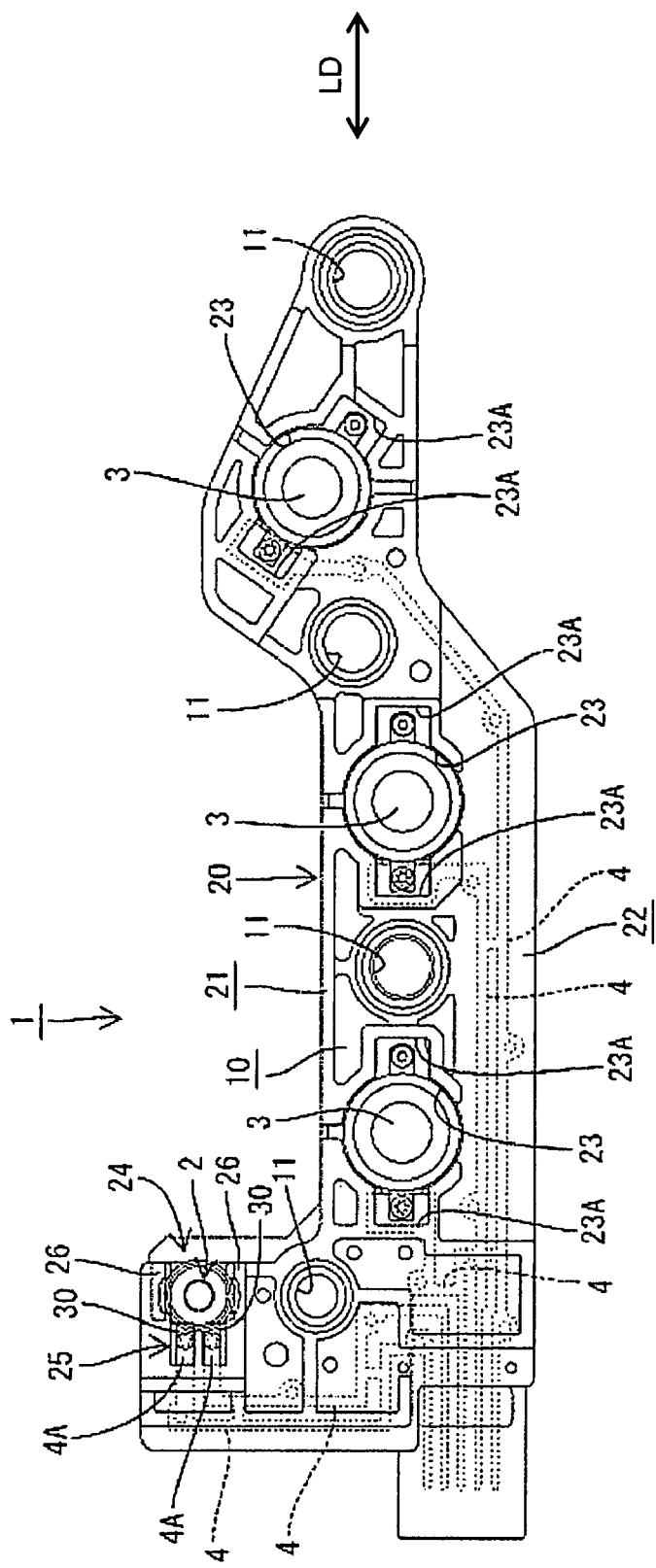
FIG. 1 is a plan view showing a state before an oil temperature sensor is mounted into a sensor mounting portion in a resin molded component fitted with a metal plate.
Figure 2:
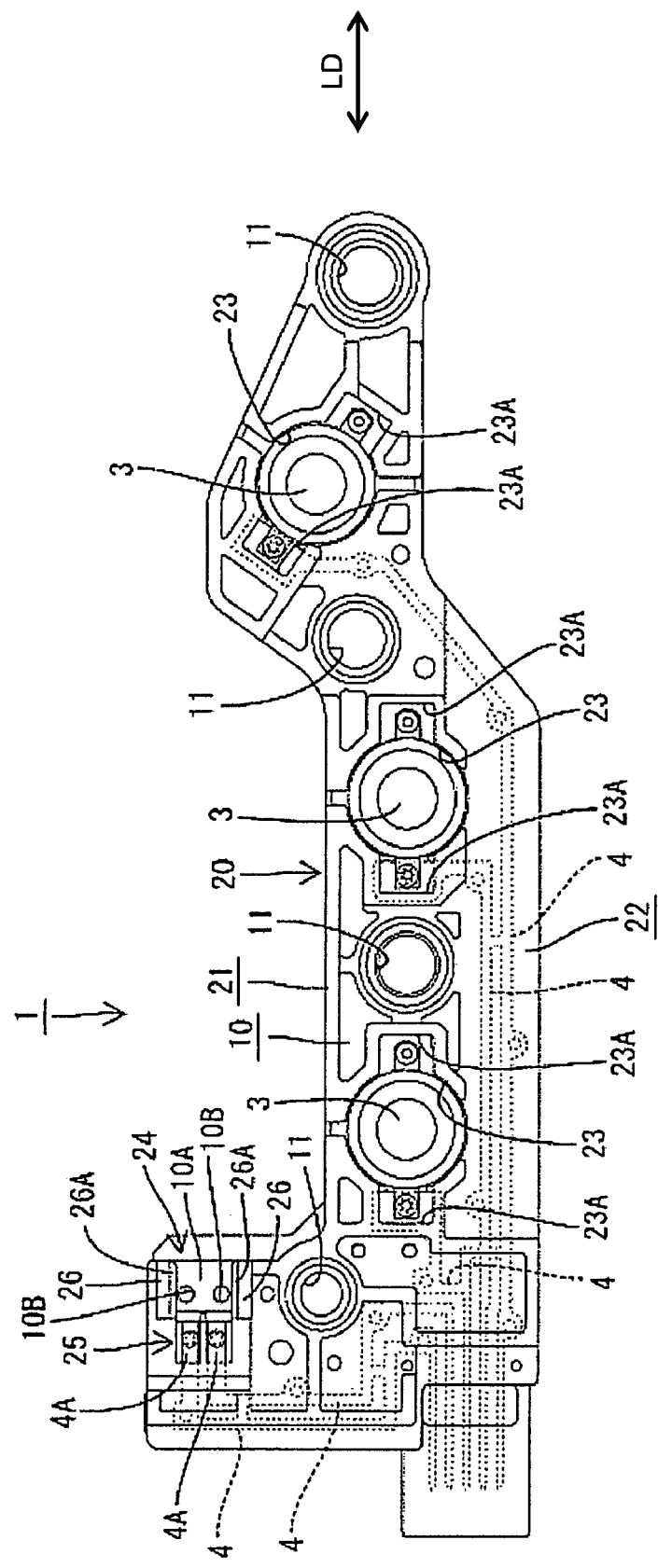
FIG. 2 is a plan view showing a state where the oil temperature sensor is fixed by riveting after being mounted into the sensor mounting portion.

A sensor unit is identified generally by the numeral 1 in FIGS. 1 to 4, and is described herein as an example of a resin molded component fit with a metal plate. The sensor unit 1 is to be mounted in an automotive transmission, and sometimes comes into contact transmission oil or other fluid. The sensor unit 1 is provided with at least one metal plate 10, a resin molded portion 20 insert-molded to be integral to the metal plate 10, and electronic components that include an oil temperature sensor 2 and oil pressure sensors 3. The resin molded portion 20 is made e.g. of a synthetic resin or a synthetic resin containing a reinforcement (e.g. 6,6 nylon containing glass fibers). Metal busbars 4 are arranged at least partly in the resin molded portion 20. The resin molded portion 20 includes a primary molded portion 21 insert-molded to be integral to the metal plate 10 at a surface of the metal plate 10 shown in FIG. 1, and a secondary molded portion 22 insert-molded to be integral to the primary molded portion 21 and to at least partly embed the busbars 4 at their intermediate parts while exposing the opposite ends of the busbars 4.

The sensor unit 1 is elongate along a longitudinal direction LD. Substantially round connection holes 11 and substantially round mounting recesses 23 are arranged alternately along the sensor unit at suitable intervals in the longitudinal direction LD. Although not shown here, the surface of the metal plate 10 is exposed at the bottoms of the mounting recesses 23. Oil pressure switches 3 are mounted in the mounting recesses 23 and are connected to the surface of the metal plate 10. Two notches 23A are formed at facing positions of a surrounding wall of each mounting hole 23, and terminals 3A of the oil pressure switch 3 project into the notches 23A. An exposed end 4A of the corresponding busbar 4 is arranged in one of the two notches 23A. Through holes are formed substantially coaxially in this exposed end 4A and in one terminal 3A of the oil pressure switch 3, and a rivet is inserted through these through holes for connection. The other end 3A of the oil pressure switch 3 is arranged in surface contact with the surface of the metal plate 10. Similarly, through holes are formed substantially coaxially in the other terminal 3A and a corresponding part of the surface of the metal plate 10, and a rivet is inserted through the through holes for connection. The connection holes 11 penetrate the metal plate 10 and the resin molded portion 20 and are used to fix the sensor unit 1 to a mating member (not shown) in the transmission.

A sensor mounting portion 24 is disposed near the connection hole 11 at the left end at the sensor unit 1 and is used to mount the oil temperature sensor 2. As shown in FIG. 1, the sensor mounting portion 24 has an open right side extending towards the outer peripheral edge of the resin molded portion 20 and an open upper side. A placing surface 10A of the metal plate is formed at a part of the sensor mounting portion 24 near the right outer peripheral edge of the resin molded portion 20 of FIG. 2 and is used to place the oil temperature sensor 2 on the surface of the metal plate 10.

The sensor mounting portion 24 is formed unitarily with opposed guiding walls 26 that project up from the surface of the metal plate 10 at opposite sides of the placing surface 10A. Each guiding wall 26 has an engaging projection 26A that extends in the transverse direction. On the other hand, a connection space 25 extends vertically at a part of the sensor mounting portion 24 behind the placing surface 10A. The exposed end 4A of the busbar 4 projects substantially normal to the longitudinal direction LD into the connection space 25 from the left of the side walls forming the connection space 25.

Figure 3:
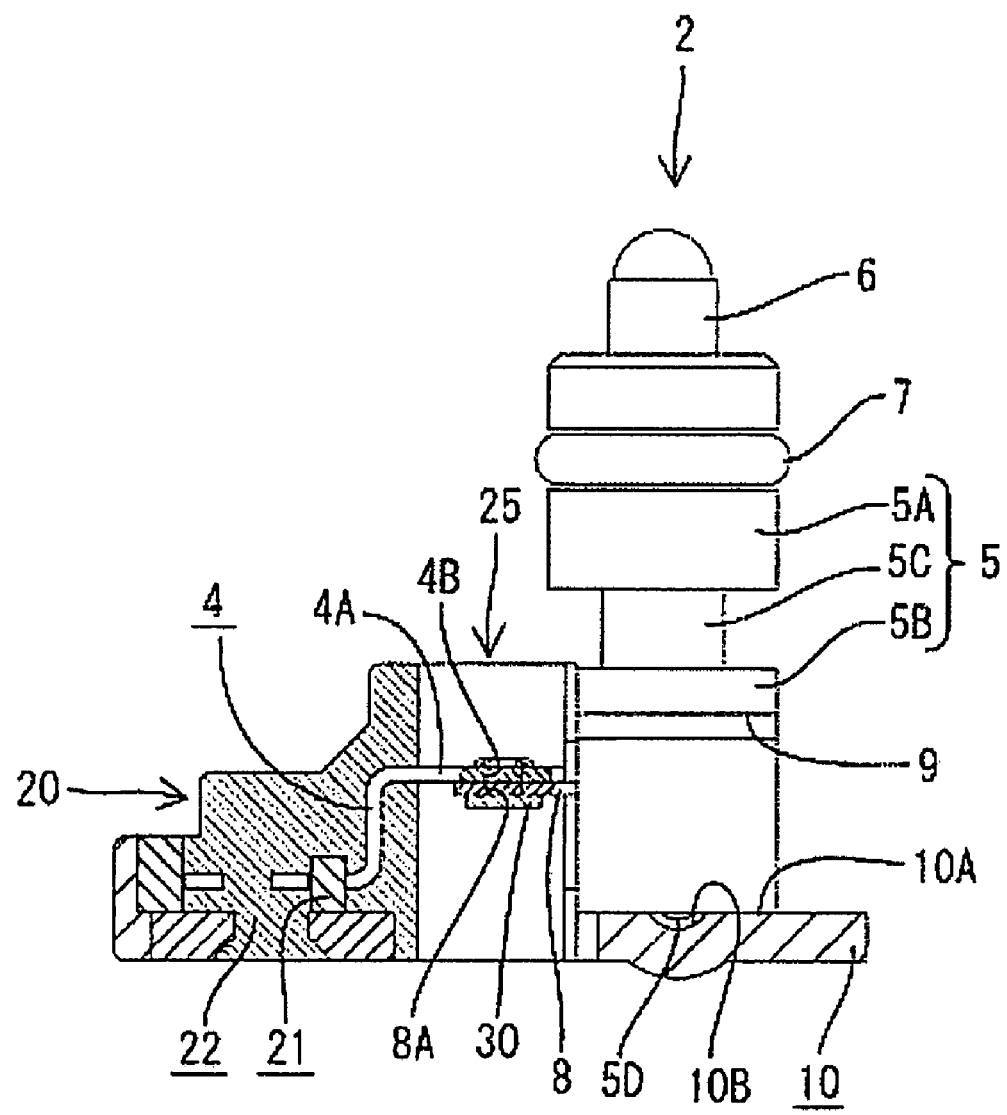
FIG. 3 is a section showing a state where a terminal of the oil temperature sensor and an exposed end of a busbar are riveted.
Figure 4:
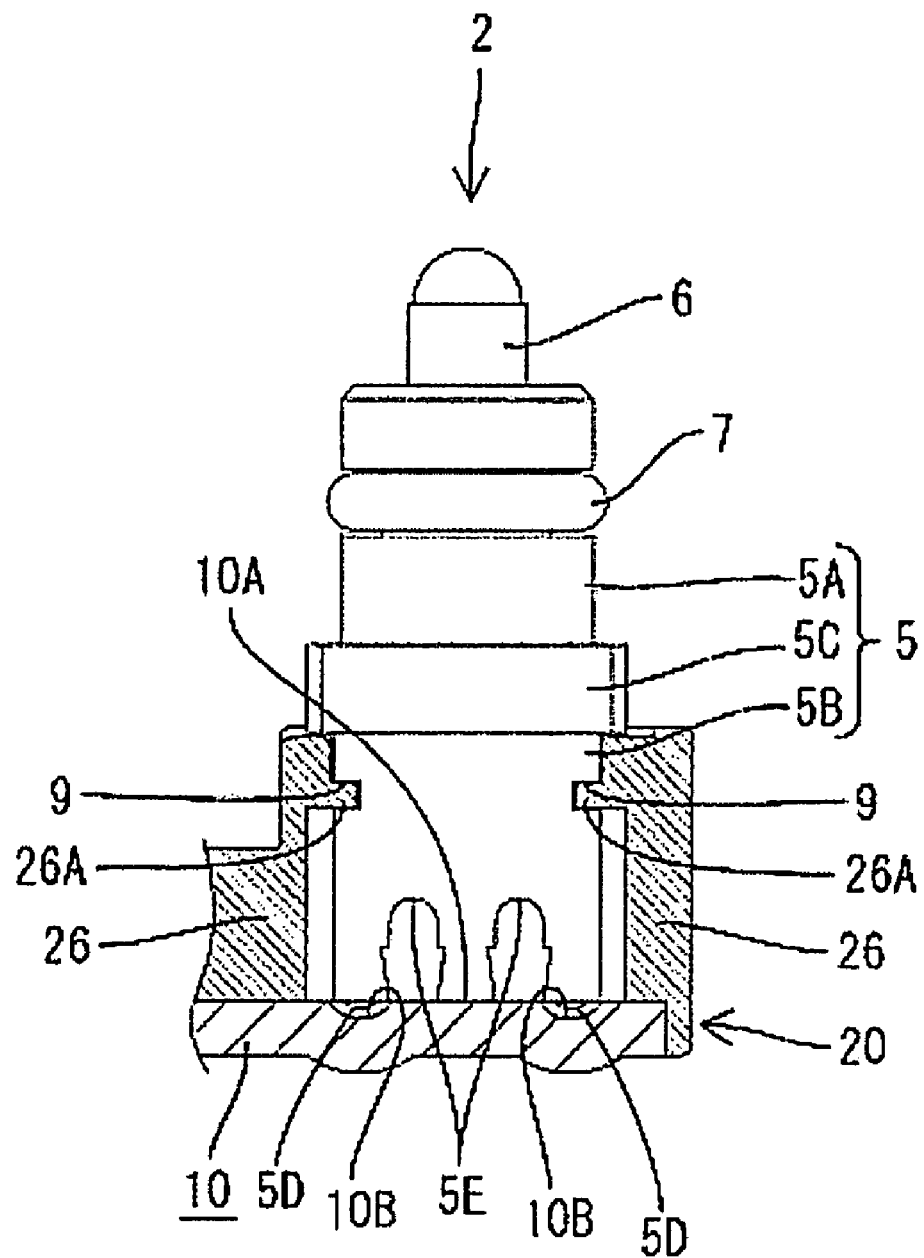
FIG. 4 is a section showing a state where engaging grooves of the oil temperature sensor and engaging projections of guiding walls are engaged.

As shown in FIG. 3, the oil temperature sensor 2 includes a main portion 5 made e.g. of a synthetic resin by injection molding, and a heat sensitive portion 6 substantially vertically arranged in the main body 5. The main body 5 is constructed so that a substantially cylindrical seal 5A and a substantially rectangular pedestal 5B are connected in this order from top via a shaft 5C. The main portion 5 is molded with molding gates set on the lower surface of the pedestal 5B. Gate marks 5D are formed at positions corresponding to the gates and are spaced apart in the transverse direction by a specified distance, as shown in FIG. 4.

Two recesses 10B are formed in the placing surface 10A of the metal plate 10 for accommodating the gate marks 5D. Accordingly, the oil temperature sensor 2 will not take an oblique posture on the placing surface 10A of the metal plate 10. Specifically, the oil temperature sensor 2 can be kept in a proper posture with the bottom surface of the pedestal 5B in substantially surface contact with the placing surface 10A. Two downwardly open wire insertion holes 5E are formed at positions between the gate marks 5D to recess the pedestal 5B in a direction normal to the plane of FIG. 4. The wire insertion holes 5E can receive wires when using the oil temperature sensor 2 connected with a terminal 8 and wires by soldering, but are not used in this embodiment.

A groove is formed circumferentially in the outer circumferential surface of the sealing portion 5A, and a seal ring 7 is fit in the groove. An upper end of the heat sensitive portion 6 projects up from the upper surface of the sealing portion 5A, and an unillustrated thermistor is embedded in the heat sensitive portion 6, preferably by resin sealing. The upper ends of the sealing portion 5A and the heat sensitive portion 6 are inserted into a sensor insertion hole that penetrates a wall of an unillustrated transmission casing to provide communication between the inside and outside of the casing for measuring the temperature of the transmission oil. The seal ring 7 is squeezed between the sensor insertion hole and the sealing portion 5A to prevent the transmission oil in the transmission casing from leaking outside.

The terminal 8 projects sideways in FIG. 3 towards the connection space 25 from the left surface of the pedestal 5B. The terminal 8 is connected electrically with the thermistor in the heat sensitive portion 6. Two engaging grooves 9 are formed in opposite side surfaces of the pedestal portion 5B adjacent to the side where the terminal 8 is arranged and extend in the projecting direction of the terminal 8. The engaging grooves 9 are engageable with the engaging projections 26A of the guiding walls 26 when the oil temperature sensor 2 is placed in the proper posture on the placing surface 10A of the metal plate 10, as shown in FIG. 4. In this engaged state, the pedestal 5B is held in a substantially vertically position. The engaging grooves 9 slidably engage the engaging projections 26A to guide the oil temperature sensor 2 sideways into a clearance between the guiding walls 26 and onto the sensor mounting portion 24. In this engaged state, the upper surface of the terminal 8 is in surface contact with the lower surface of the exposed end 4A of the busbar 4 in the connection space 25, as shown in FIG. 3. At this time, the fixing holes 8A, 4B that penetrate the terminal 8 and the exposed end 4A of the busbar 4 are substantially coaxial and can receive a rivet 30 to hold the oil temperature sensor 2 on the placing surface 10A of the metal plate 10.

The oil temperature sensor 2 is mounted in the sensor mounting portion 24 of the sensor unit 1 by sliding the oil temperature sensor 2 sideways into the clearance between the guiding walls 26 so that the engaging grooves 9 engage the engaging projections 26A. The gate marks 5D of the main portion 5 of the oil temperature sensor 2 enter the recesses 10B of the placing surface 10A of the metal plate 10 when the oil temperature sensor 2 is guided to a proper insertion position. As a result, the oil temperature sensor 2 assumes a proper vertical posture with the bottom surface of the pedestal 5B of the oil temperature sensor 2 in surface contact with the placing surface 10A. At this time, the upper surface of the terminal 8 of the oil temperature sensor 2 and the lower surface of the exposed end 4A of the busbar 4 are in surface contact, and the fixing holes 8A, 4A are arranged coaxially.

The rivet 30 then is inserted through the fixing holes 8A, 4A and is crimped from above and below by using a crimping apparatus in the connection space 25. As a result, the terminal 8 of the oil temperature sensor 2 and the exposed end 4A of the busbar 4 are connected by riveting so that the oil temperature sensor 2 is kept placed on the placing surface 10A of the metal plate 10 in the proper posture. The riveted connection assures that the oil temperature sensor 2 will not be distanced up from the placing surface 10A or held with an unnecessary stress exerted on connected parts of the terminal 8 and the exposed end 4A. It should be understood, however, that other forms of fixing may be adopted according to the circumstances, such as soldering, crimping, welding, fixing by screw and bolt or the like.

The positional accuracy of the exposed end 4A of the busbar 4 can be improved since the exposed end 4A is held tightly held between a pair of forming dies while insert-molding the resin molded portion 20. Thus, the riveted connection of the terminal 8 of the oil temperature sensor 2 and the exposed end 4A of the busbar 4 holds the oil temperature sensor 2 at a proper mount position. Therefore, there is no likelihood that the oil temperature sensor 2 is held distanced up from the placing surface 10A of the metal plate 10 and no unnecessary stress will act on connected parts by the interference of the oil temperature sensor 2 with the placing surface 10A of the metal plate 10. Further, the terminal 8 of the oil temperature sensor 2 and the exposed end 4A of the busbar 4 are connected directly without interposing a wire or the like between the oil temperature sensor 2 and the busbar 4. Hence, there is no decrease of capacitance.

The gate marks 5D of the oil temperature sensor 2 fit in the recesses 10B of the placing surface 10 of the metal plate 10 to align the oil temperature sensor 2 in the proper posture on the placing surface 10A of the metal plate 10. Accordingly, the oil temperature sensor 2 will not be inclined by the interference of the gate marks 5D thereof with the placing surface 10A of the metal plate 10. As a result, the terminal 8 of the oil temperature sensor 2 and the exposed end 4A of the busbar 4 can be placed accurately over one another before riveting, and riveting can be performed more easily.

The primary molded portion can be a core that is insert-molded to be integral to the metal plate 10. The busbars 4 then can be insert-molded during the secondary molding. Thus, the positional accuracy of the exposed ends 4A of the busbars 4 relative to the placing surface 10A of the metal plate 10 can be improved as compared to the case where the busbars 4 are insert-molded during the primary molding.

The oil temperature sensor 2 can be held and positioned by the guiding walls 26 before the connection by riveting. Accordingly, it is not necessary to fix the oil temperature sensor 2 by the hand on the placing surface 10A of the metal plate 10 to prevent displacement until riveting is performed.

The engaging projections 26A engage the engaging grooves 9 to hold the oil temperature sensor 2 so as not to be easily detachable before the riveting. Accordingly, even if a force is exerted on the terminal 8 of the oil temperature sensor 2 at the time of riveting, there is no likelihood that the terminal 8 will displace vertically and, therefore, riveting can be performed reliably.

The invention is not limited to the above described and illustrated embodiment. For example, the following embodiments are also embraced by the technical scope of the present invention.

The electronic components include both the oil temperature sensor 2 and the oil pressure switches 3 in the foregoing embodiment. However, only the oil temperature sensor 2 or only the oil pressure switches 3 may be electronic components according to the invention.

Inclination of the oil temperature sensor 2 is prevented by the recesses 10B for accommodating the gate marks 5D in the foregoing embodiment. However, it is not always necessary to provide the recesses 10B. In such a case, it is preferable to use gate mark-less electronic components or remove the gate marks 5D beforehand using a file or the like.

The busbars 4 are insert-molded during the secondary molding in the foregoing embodiment. However, they may be insert-molded during the primary molding and the secondary molding may be performed using this primary molded component as a core. In short, it is not always necessary to insert-mold the busbars 4 during the secondary molding, provided that the positions of the exposed ends 4A relative to the placing surface 10A of the metal plate 10 are kept accurately by insert-molding the exposed ends 4A of the busbars 4 while tightly holding them by forming dies during the molding.

The guiding walls 26 are formed at the opposite sides of the oil temperature sensor 2 in the foregoing embodiment. However, the guiding walls 26 may not be provided or a single guiding wall 26 that can contact only one side surface of the oil temperature sensor 2 may be provided.

The oil temperature sensor 2 is slid sideways into the clearance between the two guiding walls 26 and is positioned vertically in the foregoing embodiment. However, the engaging projections 26A may be formed along vertical direction and the engaging grooves 9 may be formed along vertical direction, so that the oil temperature sensor 2 is mountable by being slid from above into the clearance between the two guiding walls 26 and the oil temperature sensor 2 may be positioned transversely according to the invention.

What is claimed is:

1. A component, comprising:
   at least one metal plate;
   a resin molded portion insert-molded to the metal plate to define an integral matrix of resin surrounding and engaging at least portions of the metal plate;
   at least one electronic component arranged substantially at the resin molded portion; and
   at least one busbar at least partly insert-molded in the resin molded portion, and the electronic component being holdable on the metal plate by fixing a portion of the busbar exposed from the resin molded portion to a terminal of the electronic component.

2. The component of claim 1, wherein the electronic component includes a main portion made of synthetic resin and formed by injection molding.

3. The component of claim 2, wherein the electronic component is formed with at least one molding gate at a part of the main portion in contact with the metal plate, and the metal plate is formed with at least one recess for at least partly accommodating a gate mark formed on the main portion of the electronic component substantially in correspondence with the gate.

4. The component of claim 1, wherein the resin molded portion includes a primary molded portion insert-molded to be integral to the metal plate, and a secondary molded portion insert-molded to be integral to the primary molded portion and to surround at least part of the busbar0.

5. The component of claim 1, further comprising guiding walls integrally formed with the metal plate and standing up from a surface of the metal plate for positioning and holding the electronic component therebetween.

6. The component claim 5, wherein the electronic component and the guiding walls include engaging portions and engaging grooves that are engageable with each other.

7. The component of claim 6, wherein the engaging portions and the engaging grooves are configured for slidably guiding the electronic component into a clearance between the guiding walls for positioning the electronic component relative to the surface of the metal plate.

8. A method for molding component, comprising:
   providing at least one metal plate;
   insert-molding a resin molded portion to define a unitary matrix of resin at least partly surrounding and engaging the metal plate;
   insert-molding at least one busbar in the resin molded portion;
   arranging at least one electronic component at the resin molded portion; and
   fixing a portion of the busbar exposed from the resin molded portion to a terminal of the electronic component for holding the electronic component on a surface of the metal plate.

9. The method of claim 8, injection molding a synthetic resin main portion of the electronic component to include at least one molding gate mark at a part of the main portion in contact with the metal plate, and forming the metal plate with at least one recess for at least partly accommodating the gate mark formed on the main portion of the electronic component.

10. The method of claim 8, wherein the step of insert-molding the resin molded portion includes the following steps:
    insert-molding a primary molded portion to be integral to the metal plate; and
    insert-molding at least one secondary molded portion to be integral to the primary molded portion and surrounding at least part of the busbar.

* * * * *